United States Patent

Brasen et al.

Patent Number: 5,861,651
Date of Patent: Jan. 19, 1999

[54] FIELD EFFECT DEVICES AND CAPACITORS WITH IMPROVED THIN FILM DIELECTRICS AND METHOD FOR MAKING SAME

[75] Inventors: Daniel Brasen, Lake Hiawatha; Eric L. Garfunkel, Somerset; Martin L. Green, Summit; Evgeni Petrovich Gusev, Piscataway, all of N.J.

[73] Assignee: Lucent Technologies Inc., Murray Hill, N.J.

[21] Appl. No.: 807,209

[22] Filed: Feb. 28, 1997

[51] Int. Cl.[6] .................................................. H01L 29/76
[52] U.S. Cl. ........................... 257/411; 257/310; 438/216
[58] Field of Search ................................... 257/411, 310, 257/410; 148/DIG. 43, DIG. 112, DIG. 114; 437/42, 43; 438/216

[56] References Cited

U.S. PATENT DOCUMENTS

| | | | |
|---|---|---|---|
| 4,980,307 | 12/1990 | Ito et al. ......................... | 148/DIG. 112 |
| 5,254,506 | 10/1993 | Hori ............................... | 148/DIG. 114 |
| 5,397,720 | 3/1995 | Kwong et al. .................. | 148/DIG. 112 |
| 5,407,870 | 4/1995 | Okada et al. ............................ | 257/411 |
| 5,629,221 | 5/1997 | Chao et al. ................................ | 257/411 |

OTHER PUBLICATIONS

Runyan et al., Semiconductor Integrated Circuit Processing Technology, pp. 22, 26, and 387, 1990.

Primary Examiner—Sara Crane

[57] ABSTRACT

In accordance with the invention an electronic device is provided with a thin film dielectric layer of enhanced reliability. The dielectric comprises a thin film of silicon oxide having maximum concentrations of nitrogen near its major interfaces. In a field effect device, the maximum adjacent the gate enhances resistance to penetration of dopants from the gate. The secondary maximum near the channel enhances resistance to current stress. The maximum near the channel is preferably displaced slightly inward from the channel to minimize effects on carrier mobility.

7 Claims, 2 Drawing Sheets

FIELD EFFECT DEVICES AND CAPACITORS WITH IMPROVED THIN FILM DIELECTRICS AND METHOD FOR MAKING SAME

FIELD OF THE INVENTION

This invention relates to electronic devices such as field effect devices and capacitors employing improved thin film dielectrics and to methods for making such devices.

BACKGROUND OF THE INVENTION

Field effect devices, such as field effect transistors, are fundamental components in modern electronics. They are basic components in most digital and many analog circuits, including circuits for data processing and telecommunications. Indeed it has been surmised that field effect transistors are among the most numerous of human-made objects.

Field effect devices typically comprise a controllable-conductivity path, called a channel, disposed between a source and a drain. A gate electrode is formed on a thin dielectric film overlying the channel. For example, the source and the drain can be n-type regions of silicon and the channel can be a p-type region connecting them. The gate electrode can be a conductively-doped polysilicon layer formed on a thin layer of silicon oxide overlying the channel.

If no voltage is applied to the gate, current cannot flow from the source to the channel or from the channel to the drain. However if a sufficient positive voltage is applied to the gate, electrons are induced into the channel region, thereby creating a continuous n-type conductive path between the source and the drain.

Capacitors are also important components of integrated circuits. A typical capacitor comprises first and second conductive layers separated by a thin dielectric film. In many circuits, such as memory circuits, capacitors and field effect devices work in conjunction and are formed from common layers.

The reliable operation of the integrated circuits is critically dependent on the reliability of the increasingly thin dielectric layers used in the circuit devices. As transistors have become smaller and more densely packed, the dielectrics have become thinner. Capacitor and gate dielectrics are now often less than 80 angstroms in thickness. With the arrival of ULSI technology, gate dielectrics are approaching thicknesses of 50 angstroms or less. For integrated circuits to work, these thin layers in each of thousands of different transistors must insulate the gate, protect the channel from migration of impurities, and resist damage from current. These demanding requirements may soon exceed the capacities of conventional silicon oxide layers.

Nitrogen doping has been used to enhance the reliability of silicon oxide dielectrics. However, in films so thin as those desired for use in VLSI and ULSI integrated circuits, it has been difficult to control the distribution of nitrogen in the film. As a consequence, it has not been possible to provide a nitrogen concentration profile that will simultaneously minimize impurity diffusion and current damage. Accordingly there is a need for devices with improved dielectric layers and methods for making them.

SUMMARY OF THE INVENTION

In accordance with the invention, an electronic device is provided with a thin film dielectric layer of enhanced reliability. The dielectric comprises a thin film of silicon oxide having maximum concentrations of nitrogen near its major interfaces. In a field effect device, the maximum adjacent the gate/$SiO_2$ interface enhances diffusion resistance to dopants from the gate. The maximum near the Si/$SiO_2$ interface enhances resistance to current stress. The concentration of nitrogen is preferably displaced slightly inward (into the oxide) from the Si/$SiO_2$ interface.

BRIEF DESCRIPTION OF THE DRAWING

The advantages, nature and various additional features of the invention will appear more fully upon consideration of the illustrative embodiments now to be described in detail. In the accompanying drawings.

It is to be understood that these drawings are for purposes of illustrating the concepts of the invention and, except for the graphs, are not to scale.

DETAILED DESCRIPTION OF THE DRAWINGS

Figure 1:
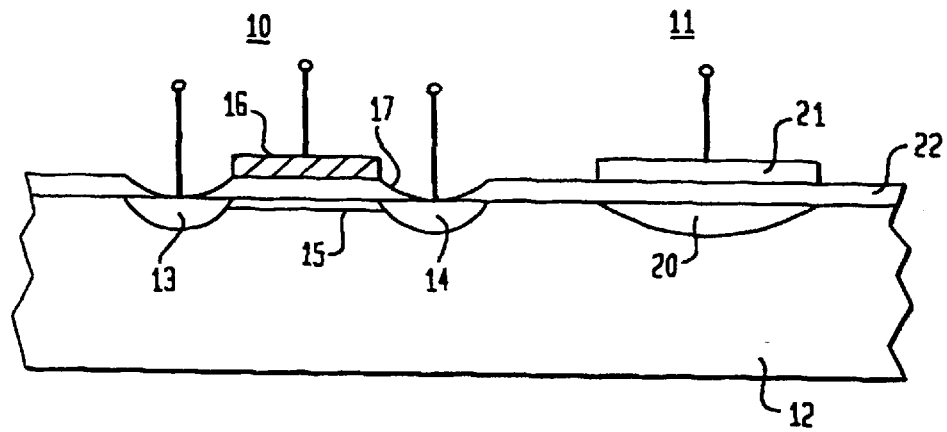
FIG. 1 is a schematic cross section of an exemplary electronic device illustrating a field effect device and a capacitor having improved dielectrics.

Referring to the drawings, FIG. 1 is a schematic cross section of an exemplary electronic device illustrating a field effect device 10 and a capacitor 11, each having improved dielectric layers in accordance with the invention. While not necessary for the invention, in this particular instance both the field effect device and the capacitor are formed on a common substrate 12, such as a crystalline silicon wafer.

The field effect device 10 (here a transistor) essentially comprises a source 13, a drain 14 and a channel 15, each of which can comprise a doped region of silicon supported by substrate 12. A gate electrode 16 overlies the channel 15 and is separated from the channel by a thin dielectric film 17. As depicted, the dielectric film has a pair of major interfaces adjacent the gate electrode 16 (the gate/ $SiO_2$ interface) and the channel 15 (the Si/$SiO_2$ interface). The film typically has a thickness of less than about 80 angstroms.

The gate electrode 16 is typically a thin layer of polycrystalline silicon doped to exhibit conductivity. Boron is a common dopant for this purpose, and the dielectric 17 desirably should prevent the boron from entering the dielectric.

When the field effect device is in the ON condition, current flows through the channel between the source and the drain. For reliability, the dielectric 17 must resist deterioration from collisions with electrons in this current flow.

In accordance with the invention, the dielectric film 17 comprises nitrogen-doped silicon oxide having maxima in its nitrogen concentration adjacent each of the major interfaces. Specifically, the film has a first nitrogen concentration maximum within 15 angstroms of the gate/$SiO_2$ interface. This maximum concentration assists in preventing diffusion of impurities into the dielectric and from the gate to the channel. Preferably this first maximum is within 10 angstroms of the gate/$SiO_2$ interface to minimize impurities entering the dielectric. A second maximum concentration, which can be lower than the first, is located within 15 angstroms of the Si/$SiO_2$ interface. This concentration provides resistance to damage from current flow (hot electrons).

Figure 5:
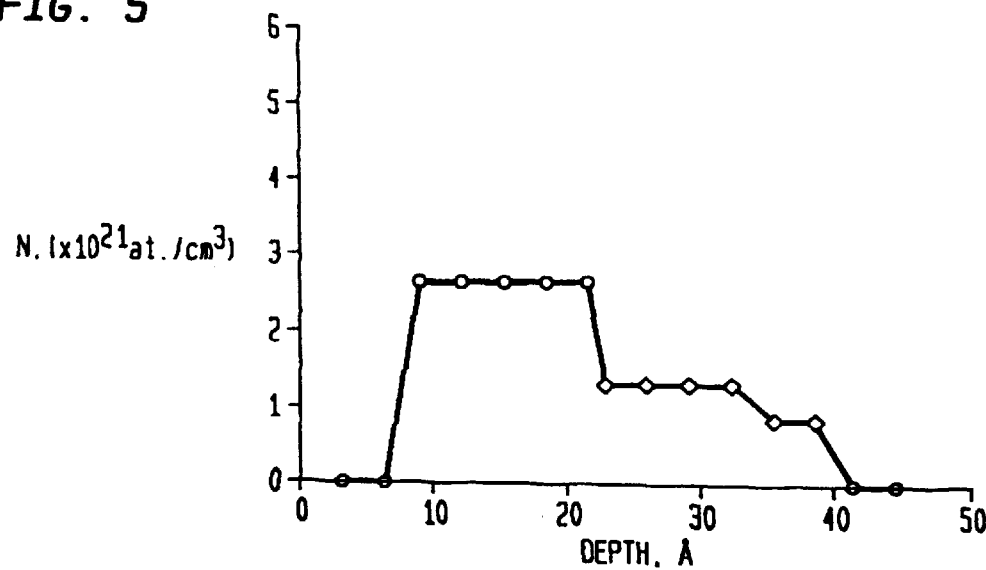

The second maximum is preferably displaced at least 5 angstroms from the Si/SiO$_2$ interface (into the SiO$_2$ region) to minimize effects on carrier mobility in the channel. An exemplary nitrogen concentration profile is shown in FIG. 5.

Capacitor 11 comprises a pair of conductive layers 20 and 21 separated by a thin dielectric film 22. Layer 20 can be conductively doped crystalline silicon and layer 21 can be a conductively-doped polycrystalline silicon film. The dielectric film 22 should resist diffusion of impurities from the layer 20 to the layer 21. The dielectric film is nitrogen-doped silicon oxide which advantageously has the same nitrogen concentration profile as described for device 10. Indeed, dielectrics 17 and 22 can be made of the same layer.

Figure 2:
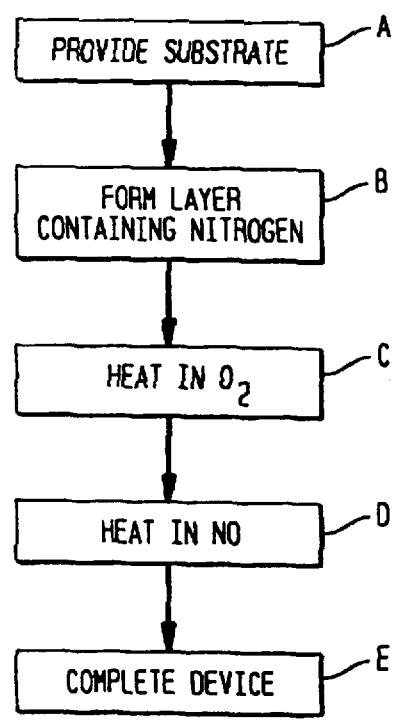
FIG. 2 is a flow diagram showing the steps of the preferred method of making an electronic device having an improved dielectric layer.

FIG. 2 illustrates the steps in making an electronic device having an improved thin film dielectric. As shown in block A of FIG. 2, the first step is to provide a substrate having an exposed silicon surface. Preferably the substrate is a conventional single crystalline silicon wafer. As a preliminary step, the silicon surface can be cleaned by a conventional process used to clean silicon substrates prior to oxidation.

The next step shown in block B is to form a thin nitrogen-containing layer on the exposed silicon surface. This layer, which is preferably nitrogen-doped silicon oxide (oxynitride), can be formed in any one of a variety of ways including heating in NO or NO$_2$, chemical vapor deposition, plasma nitridation and plasma implantation. It is preferably formed by heating the substrate in a gas containing NO to produce a thin, self-limiting layer of oxynitride about 20 angstroms thick. Typical times and temperatures are 5 minutes—5 hours and 700°–1000° C., respectively. Total gas pressure can be 10 Torr or higher and is preferably 1 atm. This layer should contain an N concentration in the range $2 \times 10^{15}$ to $2 \times 10^{13}$ N/cm$^2$. It typically contains about $7 \times 10^{14}$ N/cm$^2$ distributed approximately uniformly in the grown layer.

Figure 3:
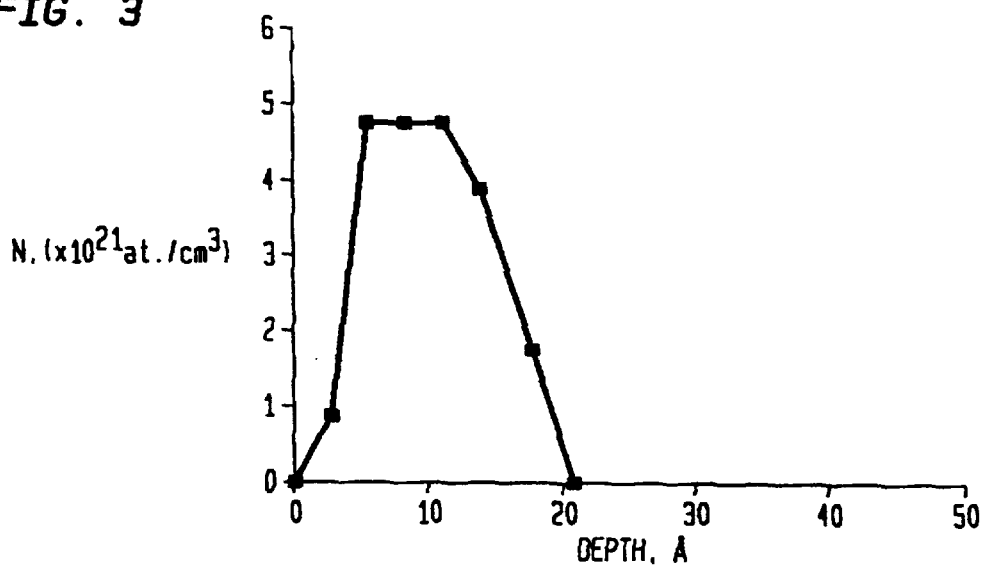
FIGS. 3, 4 and 5 are graphical illustrations showing the nitrogen concentration profiles in a dielectric film at various stages of the process of FIG. 2.

An exemplary nitrogen concentration profile after this step is shown in FIG. 3. The bulk of the nitrogen concentration is within 15 angstroms of the Si/SiO$_2$ interface.

The third step (block C of FIG. 2) is to oxidize the workpiece in a gas containing O$_2$ to increase the total thickness to a desired level less than about 70 angstroms. Typical times and temperatures are similar to those in step B. After this step, the distribution of N in the layer is largely intact, but is displaced into the SiO$_2$ portion of the Si/SiO$_2$ interface due to the growth of new oxide from the interface.

Figure 4:
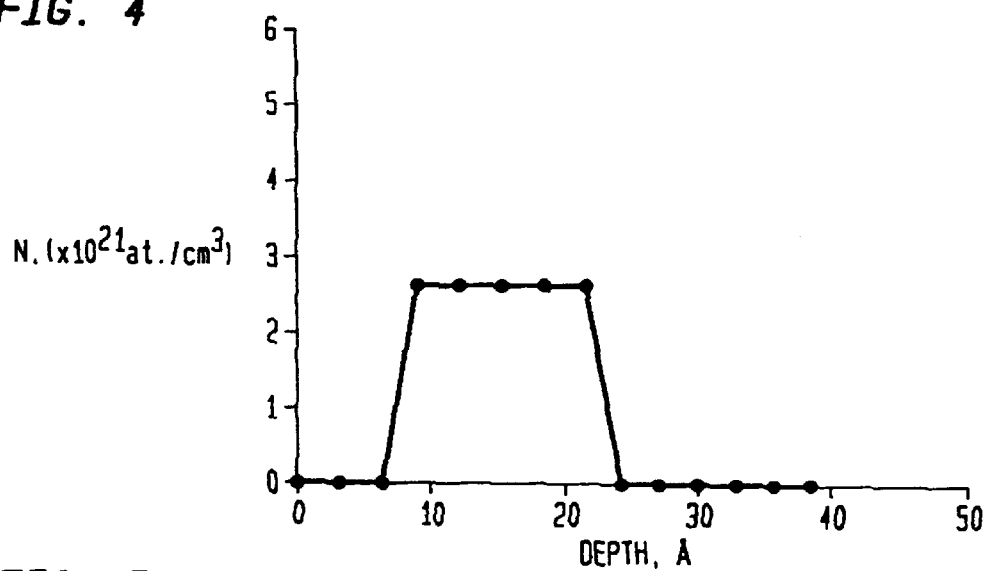

An exemplary nitrogen concentration profile after this step is shown in FIG. 4. As can be seen, the oxide growth is from the Si/SiO$_2$ interface, moving the N concentration into the SiO$_2$ region.

The next step shown in block D is to heat (anneal) the workpiece in a gas containing NO. This step results in little oxidation at the Si/SiO$_2$ interface, but further nitridation of the SiO$_2$ in the region adjacent the Si/SiO$_2$ interface. Process parameters are those described for step B. The final structure is typically about 50 angstroms thick, with N concentrated most heavily near the major interfaces.

An exemplary nitrogen concentration profile after this step is shown in FIG. 5. The nitrogen concentration has a first maximum near the gate/ SiO$_2$ interface (within ten angstroms) and a second (lower) maximum near the Si/SiO$_2$ interface. With thicker oxidation in step C, the N concentration in the central region between the two interfaces would advantageously drop below both maxima. This structure provides a dielectric layer with an N concentration profile closely approximating the ideal for a gate dielectric.

The final step (block E) is to complete a field effect device in the conventional manner using the dielectric film as the gate dielectric. For example, polysilicon can be applied over the dielectric and patterned to define the gate, source and drain of a field effect transistor in accordance with the widely used self-aligned silicon gate process. This process is described, for example, in S. J. Hillenius et al., "A Symmetric Sub-Micron CMOS Technology", *IEDM Tech. Digest,* 252 (1986) which is incorporated herein by reference. Alternatively, a capacitor can be completed by applying polysilicon over the dielectric and patterning the polysilicon to define the electrode of a capacitor.

The invention can be more clearly understood by consideration of the following specific example.

EXAMPLE

A silicon wafer is cleaned by a conventional pre-gate oxidation clean. Then it is placed in a vertical oxidation furnace and oxidized in an N$_2$/NO (3.5 lpm/0.5 lpm) mixture for one hour at 850° C., at atmospheric pressure. This results in an oxynitride film about 2 nm thick, with nitrogen approximately uniformly distributed. The wafer is then oxidized in-situ in pure O$_2$ (4 lpm) for four hours at 850° C. This results in a film about 4.5 nm thick, with the original nitrogen now pushed to the top of the film, due to the new underlying oxide growth. Finally, the wafer is again exposed to the N$_2$/NO mixture for 45 minutes at 850° C., again in-situ. This results in very little new oxidation, but significant renitridation of the Si/SiO$_2$ interface. Importantly, the original nitrogen in the film is preserved. Thus, there is nitrogen at both the top and bottom of the film, resulting in an ideal nitrogen profile.

A fourth and optional step, in which the structure is exposed to O$_2$ for a second time, can also be used. In this way, the nitrogen concentration maximum adjacent the Si/SiO$_2$ can be nudged from the interface (at least 5 angstroms into the SiO$_2$ region) to minimize effects on channel carrier mobility.

It is to be understood that the above-described embodiments are illustrative of only a few of the many possible specific embodiments which can represent applications of the principles of the invention. Numerous and varied other arrangements can be readily devised in accordance with these principles by those skilled in the art without departing from the spirit and scope of the invention.

What is claimed:

1. In an electronic device comprising a first conductive layer of doped crystalline silicon substrate and a second conductive layer of doped polycrystalline silicon separated by a dielectric film of nitrogen-doped silicon oxide, said dielectric film having a pair of major interfaces adjacent said first and second conductive layers respectively and a thickness of less than about 80 angstroms, the improvement wherein:

said nitrogen-doped silicon oxide has a nitrogen concentration with a thickness profile characterized by a first maximum concentration located within 15 angstroms from said interface adjacent said polycrystalline silicon and a second maximum located within 15 angstroms from said interface adjacent said crystalline silicon substrate and at least 5 angstroms from said substrate.

2. An electronic device according to claim 1 wherein said nitrogen-doped silicon oxide has said first maximum nitrogen concentration located within about 10 angstroms of said interface adjacent said layer of polycrystalline silicon.

3. An electronic device according to claim 2 wherein said polycrystalline silicon is doped with boron.

4. In a field effect electronic device comprising a substrate-supported source, drain and channel and a gate electrode overlying said channel, said gate electrode separated from said channel by a dielectric film of nitrogen-doped silicon oxide, said dielectric film having a pair of major interfaces adjacent said gate electrode and said channel, respectively, and a thickness of less than about 80 angstroms, the improvement wherein:

said nitrogen-doped silicon oxide has a nitrogen concentration characterized by a first maximum concentration located within 15 angstroms from said interface adjacent said gate electrode and a second maximum located within 15 angstroms from said interface adjacent said channel and at least 5 angstroms from said channel.

5. A device according to claim 4 wherein said nitrogen-doped silicon oxide has a nitrogen concentration characterized by a maximum concentration located within 10 angstroms from said interface adjacent said gate electrode.

6. A device according to claim 4 wherein said gate electrode comprises polysilicon.

7. A device according to claim 4 wherein said gate electrode comprises polysilicon doped with boron.

\* \* \* \* \*